United States Patent
Li et al.

(10) Patent No.: US 10,446,062 B2
(45) Date of Patent: Oct. 15, 2019

(54) FLEXIBLE DISPLAY SCREEN STRUCTURE AND MANUFACTURING METHOD THEREOF

(71) Applicant: Wuhan China Star Optoelectronics Technology Co., Ltd., Wuhan (CN)

(72) Inventors: Shuang Li, Wuhan (CN); Liang Sun, Wuhan (CN)

(73) Assignee: WUHAN CHINA STAR OPROELECTRONICS TECHNOLOGY CO., LTD., Wuhan, Hubei (CN)

( * ) Notice: Subject to any disclaimer, the term of this patent is extended or adjusted under 35 U.S.C. 154(b) by 390 days.

(21) Appl. No.: 15/505,115

(22) PCT Filed: Dec. 29, 2016

(86) PCT No.: PCT/CN2016/113023
§ 371 (c)(1),
(2) Date: Feb. 20, 2017

(87) PCT Pub. No.: WO2018/107531
PCT Pub. Date: Jun. 21, 2018

(65) Prior Publication Data
US 2019/0156708 A1 May 23, 2019

(30) Foreign Application Priority Data

Dec. 15, 2016 (CN) .......................... 2016 1 1163661

(51) Int. Cl.
*H01L 27/32* (2006.01)
*H01L 51/00* (2006.01)
(Continued)

(52) U.S. Cl.
CPC ................ *G09F 9/301* (2013.01); *G09F 9/33* (2013.01); *H01L 21/70* (2013.01);
(Continued)

(58) Field of Classification Search
CPC ....... G09F 9/301; G09F 9/33; H01L 27/3258; H01L 51/0011; H01L 51/0097; H01L 27/3276; H01L 51/56
See application file for complete search history.

(56) References Cited

U.S. PATENT DOCUMENTS 9,829,923 B2 * 11/2017 Lee ..................... G06F 1/1679
10,163,375 B2 * 12/2018 Zhang ................. G06F 3/0412
(Continued)

FOREIGN PATENT DOCUMENTS

CN        104950535 A      9/2015

OTHER PUBLICATIONS

Yi, Chinese Patent application CN104950535A, dated Sep. 2015, machine translation (Year: 2015).*

*Primary Examiner* — Tracie Y Green
(74) *Attorney, Agent, or Firm* — Leong C. Lei

(57) ABSTRACT

A flexible display screen structure includes an outward curving zone arranged between a first display zone and a second display zone and the three zones commonly possess and share a common flexible substrate. Each of the first display zone and the second display zone are provided with commonly arranged array pixel circuits, while the outward curving zone is only provided with a metallic connection line for connection between the array pixel circuit of the first display zone and the array pixel circuit of the second display zone and a flexible organic layer covering the flexible organic layer of the metallic connection lines so as to reduce metal wires or lines arranged in the outward curving zone to allow the first display zone and the second display zone to be outwardly curvable through the outward curving zone.

9 Claims, 8 Drawing Sheets

(51) Int. Cl.
      *H01L 51/56*       (2006.01)
      *G09F 9/30*        (2006.01)
      *G09F 9/33*        (2006.01)
      *H01L 21/70*       (2006.01)

(52) U.S. Cl.
      CPC ...... *H01L 27/3258* (2013.01); *H01L 27/3276* (2013.01); *H01L 51/0011* (2013.01); *H01L 51/0097* (2013.01); *H01L 51/56* (2013.01); *H01L 2227/323* (2013.01); *H01L 2251/5338* (2013.01)

(56) References Cited

U.S. PATENT DOCUMENTS

2014/0097408 A1     4/2014    Kim et al.
2015/0023030 A1*   1/2015    Tsukamoto ........... G06F 1/1652
                                                                 362/419

* cited by examiner

FLEXIBLE DISPLAY SCREEN STRUCTURE AND MANUFACTURING METHOD THEREOF

BACKGROUND OF THE INVENTION

1. Field of the Invention

The present invention relates to the field of display technology, and more particular to a flexible display screen structure and a manufacturing method thereof.

2. The Related Arts

With the progress of display technology, people's requirements for terminal screens are getting higher and higher. Flexible display screens become the favorite and attraction of the people.

Organic light emitting display (OLED) has not only excellent displaying performance, but also characteristics of being self-luminous, simple structure, being ultra light and thin, fast response speed, wide view angle, low power consumption and realization of flexible displaying, and is thus regarded as a "dream display", attracting attention of major display manufacturers, making it the main force of the third generation displays in the field of display technology.

A flexible display screen similarly requires formation of an arrayed arrangement of pixel structures on a substrate and each pixel structure generally comprises metallic components such as a thin-film transistor (TFT) and a capacitor.

Currently, due to technical limitations regarding flexible materials and structural designs, the flexible display screen cannot yet allow for perfect bending of arbitrary curvature of radius and diverse curving.

Generally, a flexible display screen is acted upon by forces that are tensile stresses when curved outward in a direction away from a displaying surface thereof, and is acted upon by forces that are compressive stresses when curved inward in a direction toward the displaying surface thereof. The stresses acting on the flexible display screen, when curving, may damage the display screen, in which the tensile stresses induced by outward curving may more easily damage the display screen. This, when considered in combination with constraint imposed by the internal structural arrangement of the display screen, such as metallic array circuit wirings densely distributed in the entirety of the display screen, causes limitations to the radius of curvature of outward curving of the flexible display screen and the reliability thereof.

SUMMARY OF THE INVENTION

An objective of the present invention is to provide a flexible display screen, which helps reduces damage of the flexible display screen during outward curving and improve reliability of outward curving so as to effectively yield of the flexible display screen.

Another objective of the present invention is to provide a manufacturing method of a flexible display screen, such that a flexible display screen manufactured with such a manufacturing method shows reduced damage and improved reliability during outward curving.

To achieve the above objectives, the present invention provides a flexible display screen structure, which comprises a flexible substrate, a first display zone arranged on the flexible substrate, a second display zone arranged on the flexible substrate, and an outward curving zone arranged on the flexible substrate and connected with the first display zone and the second display zone;

wherein each of the first display zone and the second display zone is provided therein with an array pixel circuit and the outward curving zone comprises a metallic connection line for connection between the array pixel circuit of the first display zone and the array pixel circuit of the second display zone and a flexible organic layer covering the metallic connection line; and the first display zone and the second display zone are outwardly curvable through the outward curving zone.

The first display zone, the second display zone, and the outward curving zone are arranged on the same side of the flexible substrate.

The flexible organic layer of the outward curving zone comprises multiple layers respectively covering upper and lower sides of the metallic connection line.

Each of the first display zone and the second display zone comprises: a buffer layer arranged on the flexible substrate, a patterned semiconductor active layer arranged on the buffer layer, a plurality of inorganic insulation layers sequentially stacked on the semiconductor active layer and the buffer layer, a metal wire laying layer arranged on a topmost one of the inorganic insulation layers and in contact with the semiconductor active layer, a first flexible organic layer covering the metal wire laying layer, an anode arranged on the first flexible organic layer and in contact with the metal wire laying layer, and a second flexible organic layer arranged on the anode and the first flexible organic layer, wherein the second flexible organic layer is structured to expose a portion of the anode and the semiconductor active layer, the metal wire laying layer, and the anode collectively constitute the array pixel circuit;

wherein the outward curving zone comprises a buffer layer arranged on the flexible substrate, a third flexible organic layer arranged on the buffer layer and covering an underside of the metallic connection line, a first flexible organic layer and a second flexible organic layer stacked on and covering an upper side of the metallic connection lines, the metallic connection line being connected with the metal wire laying layers of the first display zone and the second display zone.

The flexible substrate is formed of a material comprising polyimide.

Each of the flexible organic layers is formed of a material comprising organic photoresist.

The present invention also provides a manufacturing method of a flexible display screen structure, which comprises the following steps:

Step S1: providing a flexible substrate, and conducting, in sequence, coating and setting a buffer layer on the flexible substrate, forming a patterned semiconductor active layer on each of areas in which a first display zone and a second display zone are to be formed, and sequentially coating and stacking a plurality of inorganic insulation layers on the semiconductor active layer and the buffer layer;

Step S2: using one mask to form metal wire laying layers, such that the metal wire laying layers are in contact with the semiconductor active layers respectively;

Step S3: using another mask to remove a portion of the metal wire laying layers in an area where an outward curving zone is to be formed and at least one of the inorganic insulation layers located thereunder;

Step S4: coating and filling an organic material in the area where the outward curving zone is to be formed to form a third flexible organic layer;

Step S5: using a further mask to form a metallic connection line in the area where the outward curving zone is to be formed to connect between the metal wire laying layers of the first display zone and the second display zone;

Step S6: coating and setting a first flexible organic layer on the metallic connection line, the metal wire laying layers, and a third one of the inorganic insulation layers;

Step S7: forming an anode on the first flexible organic layer in each of the areas where the first display zone and the second display zone are to be formed;

wherein the anodes are respectively in contact with the metal wire laying layers and the semiconductor active layers, the metal wire laying layers, and the anodes constitute array pixel circuits respectively; and Step S8: forming a second flexible organic layer on the anodes and the first flexible organic layer;

wherein the second flexible organic layer is arranged to expose portions of the anodes.

The flexible substrate is formed of a material comprising polyimide.

Each of the first flexible organic layer, the second flexible organic layer and the third flexible organic layer is formed of a material comprising organic photoresist.

The present invention further provides a manufacturing method of a flexible display screen structure, which comprises the following steps:

Step S1: providing a flexible substrate, and conducting, in sequence, coating and setting a buffer layer on the flexible substrate, forming a patterned semiconductor active layer on each of areas in which a first display zone and a second display zone are to be formed, and sequentially coating and stacking a plurality of inorganic insulation layers on the semiconductor active layer and the buffer layer;

Step S2: using one mask to form metal wire laying layers, such that the metal wire laying layers are in contact with the semiconductor active layers respectively;

Step S3: using another mask to remove a portion of the metal wire laying layers in an area where an outward curving zone is to be formed and at least one of the inorganic insulation layers located thereunder;

Step S4: coating and filling an organic material in the area where the outward curving zone is to be formed to form a third flexible organic layer;

Step S5: using a further mask to form a metallic connection line in the area where the outward curving zone is to be formed to connect between the metal wire laying layers of the first display zone and the second display zone;

Step S6: coating and setting a first flexible organic layer on the metallic connection line, the metal wire laying layers, and a third one of the inorganic insulation layers;

Step S7: forming an anode on the first flexible organic layer in each of the areas where the first display zone and the second display zone are to be formed;

wherein the anodes are respectively in contact with the metal wire laying layers and the semiconductor active layers, the metal wire laying layers, and the anodes constitute array pixel circuits respectively; and Step S8: forming a second flexible organic layer on the anodes and the first flexible organic layer;

wherein the second flexible organic layer is arranged to expose portions of the anodes;

wherein the flexible substrate is formed of a material comprising polyimide; and wherein each of the first flexible organic layer, the second flexible organic layer and the third flexible organic layer is formed of a material comprising organic photoresist.

The efficacy of the present invention is that the present invention provides a flexible display screen structure, which comprises an outward curving zone arranged between a first display zone and a second display zone, such that these three ones commonly possess and share the same flexible substrate, and the first display zone and the second display zone are provided therein with commonly arranged array pixel circuits, while the outward curving zone is only provided therein with a metallic connection line for connection between the array pixel circuit of the first display zone and the array pixel circuit of the second display zone and a flexible organic layer covering the metallic connection lines so as to reduce metal wires or lines arranged in the outward curving zone and add a flexible organic layer in the outward curving zone, whereby the first display zone and the second display zone may achieve outward curving through the outward curving zone and poor displaying of the entire display resulting from cracking and peeling of a metal layer during outward curving of the flexible display screen can be reduced, and thus reducing the extent of damage of the flexible display screen during outward curving, improving reliability of outward curving, and effectively enhancing yield of the flexible display screen. The present invention provides a manufacturing method of a flexible display screen structure, which allows a portion of a metal wire laying layer in an area where an outward curving zone is to be formed and at least one inorganic insulation located thereunder to be removed and then fills an organic material therein to form a third flexible organic layer, followed by formation of a metallic connection line to connect metal wire laying layers of the first display zone and the second display zone to each other, thereby reducing metal wiring inside the outward curving zone, while adding a flexible organic layer in the outward curving zone to allow the first display zone and the second display zone to outwardly curve through the outward curving zone in a manner of reducing poor displaying of the entire display resulting from cracking and peeling of a metal layer during outward curving of the flexible display screen so as to reduce the extent of damage of the flexible display screen during outward curving, improve reliability of outward curving, and effectively enhance yield of the flexible display screen.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Referring collectively to FIGS. 1-5, firstly, the present invention provides a flexible display screen structure, which comprises a flexible substrate 1, a first display zone 2 arranged on the flexible substrate 1, a second display zone 4 arranged on the flexible substrate 1, and an outward curving zone 3 arranged on the flexible substrate 1 and connected with the first display zone 2 and the second display zone 4.

The first display zone 2 and the second display zone 4 are provided for effective displaying and both are provided therewith commonly arranged array pixel circuits. The outward curving zone 3 is a non-displaying zone and comprises a metallic connection line 31 that connect the array pixel circuit of the first display zone 2 and the array pixel circuit of the second display zone 4 and flexible organic layers covering the metallic connection line.

FIG. 1-5 show, in a schematic way, the first display zone 2, the second display zone 4 and the outward curving zone 3 located on the same side of the flexible substrate 1, but alternatively, one of the first display zone 2 and the second display zone 4 and the outward curving zone 3 are arranged on one side of the flexible substrate 1, while the other one of the first display zone 2 and the second display zone 4 is located on the other side of the flexible substrate 1.

Figure 5:
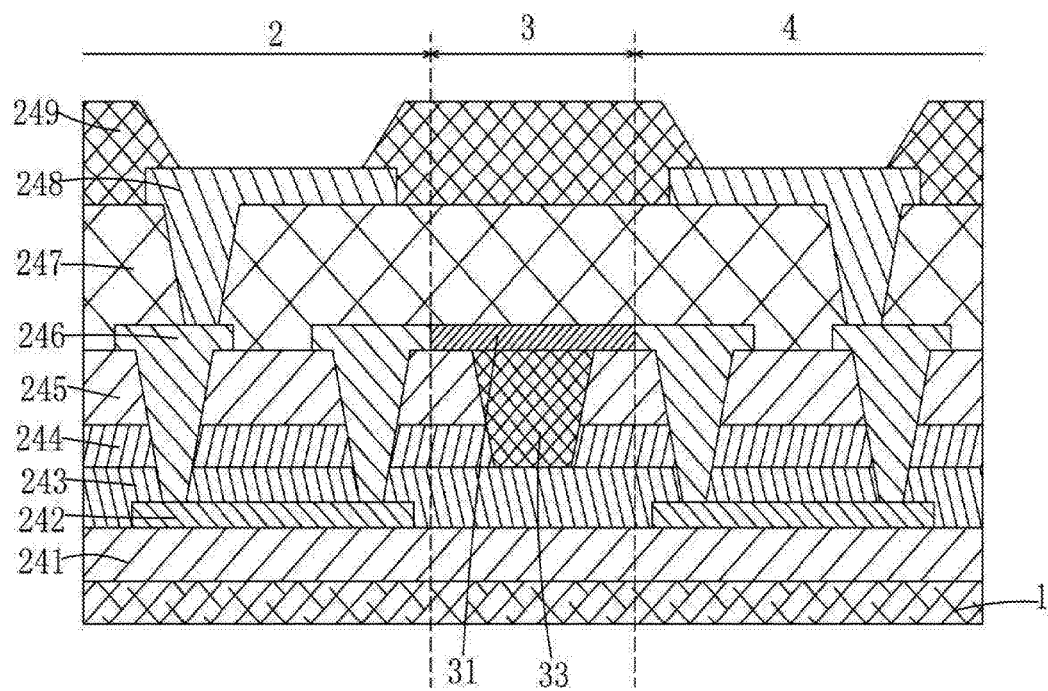
FIG. 5 is a cross-sectional view illustrating the flexible display screen structure according to the present invention in a flattened condition.

Specifically, as shown in FIG. 5, each of the first display zone 2 and the second display zone 4 comprises: a buffer layer 241 arranged on the flexible substrate 1; a semiconductor active layer 242 that is patterned and arranged on the buffer layer 241; a first inorganic insulation layer 243, a second inorganic insulation layer 244, and a third inorganic insulation layer 245 that are stacked in sequence on the semiconductor active layer 242 and the buffer layer 241; a metal wire laying layer 246 arranged on the third inorganic insulation layer 245 and in contact with the semiconductor active layer 242; a first flexible organic layer 247 covering the metal wire laying layer 246; an anode 248 arranged on the first flexible organic layer 247 and in contact with the metal wire laying layer 246, and a second flexible organic layer 249 arranged on the anode 248 and the first flexible organic layer 247, wherein the second flexible organic layer 249 is structured to expose a portion of the anode 248 and the semiconductor active layer 242, the metal wire laying layer 246, and the anode 248 collectively constitute the array pixel circuit.

The outward curving zone 3 comprises a buffer layer 241 arranged on the flexible substrate 1; a third flexible organic layer 33 arranged on the buffer layer 241 and lapping under and covering an underside of the metallic connection line 31; and a first flexible organic layer 247 and a second flexible organic layer 249 stacked on and covering an upper side of the metallic connection lines 31, wherein the metallic connection line 31 connects the metal wire laying layers 246 of the first display zone 2 and the second display zone 4. It is noted the third flexible organic layer 33 is extended at most to the buffer layer 241, and alternatively, an inorganic insulation layer can be arranged between the third flexible organic layer 33 and the buffer layer 241, such as the first inorganic insulation layer 243 shown in FIG. 5 for separation.

Further, the flexible substrate 1 is formed of a material comprising polyimide (PI).

The semiconductor active layer 242 is preferably formed of a material comprising low temperature poly-silicon (LTPS). Each of the buffer layer 241, the first inorganic insulation layer 243, the second inorganic insulation layer 244, and the third inorganic insulation layer 245 is preferably formed of a material comprising silicon nitride (SiNx), silicon oxide (SiOx), or a combination thereof. The metal wire laying layer 246 comprises a densely distributed arrangement, which generally comprises scan lines, data lines, and various electrodes of thin-film transistors. The anode 248 is preferably formed of a material comprising indium tin oxide (ITO). Each of the first flexible organic layer 247, the second flexible organic layer 249, and the third flexible organic layer 33 is preferably formed of a material comprising organic photoresist.

Figure 2:
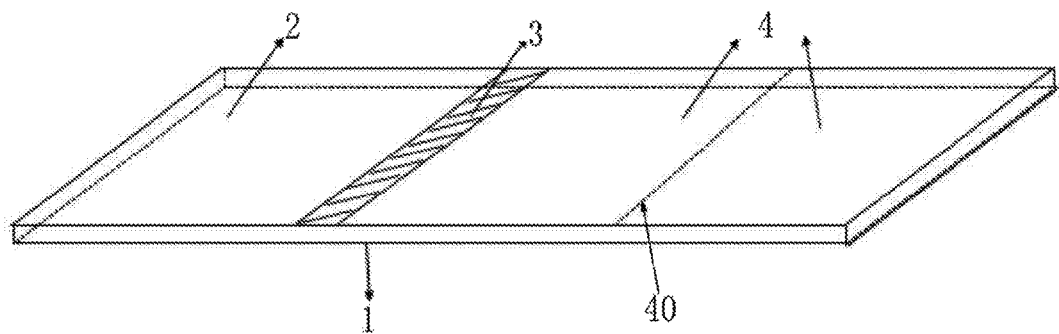
FIG. 2 is a schematic perspective view showing the flexible display screen structure according to the present invention in a flattened condition.

Bending or curving the flexible display screen in a direction opposite to a displaying surface thereof is defined as "outward curving", while bending or curving in a direction toward the displaying surface is defined as "inward curving". The first display zone 2 and the second display zone 4 may be outwardly curved by means of the arrangement of the outward curving zone 3. The second display zone 4 is provided with at least one inward curving line 40, and inward curving can be achieved along the inward curving line 40. Thus, the flexible display screen structure according to the present invention allows a flexible display screen to perform displaying with diverse modes and multiple configurations. Examples are given below:

As shown in FIG. 2, the first display zone 2, the outward curving zone 3, and the second display zone 4 are all spread and flattened and under this condition, each of the first display zone 2 and the second display zone 4 may achieve displaying with a maximum surface area thereof. Due to the outward curving zone 3 taking only a small fraction of the entire surface area of the display screen, it is generally possible to ignore the influence of the outward curving zone 3 on entire-surface displaying.

Figure 1:
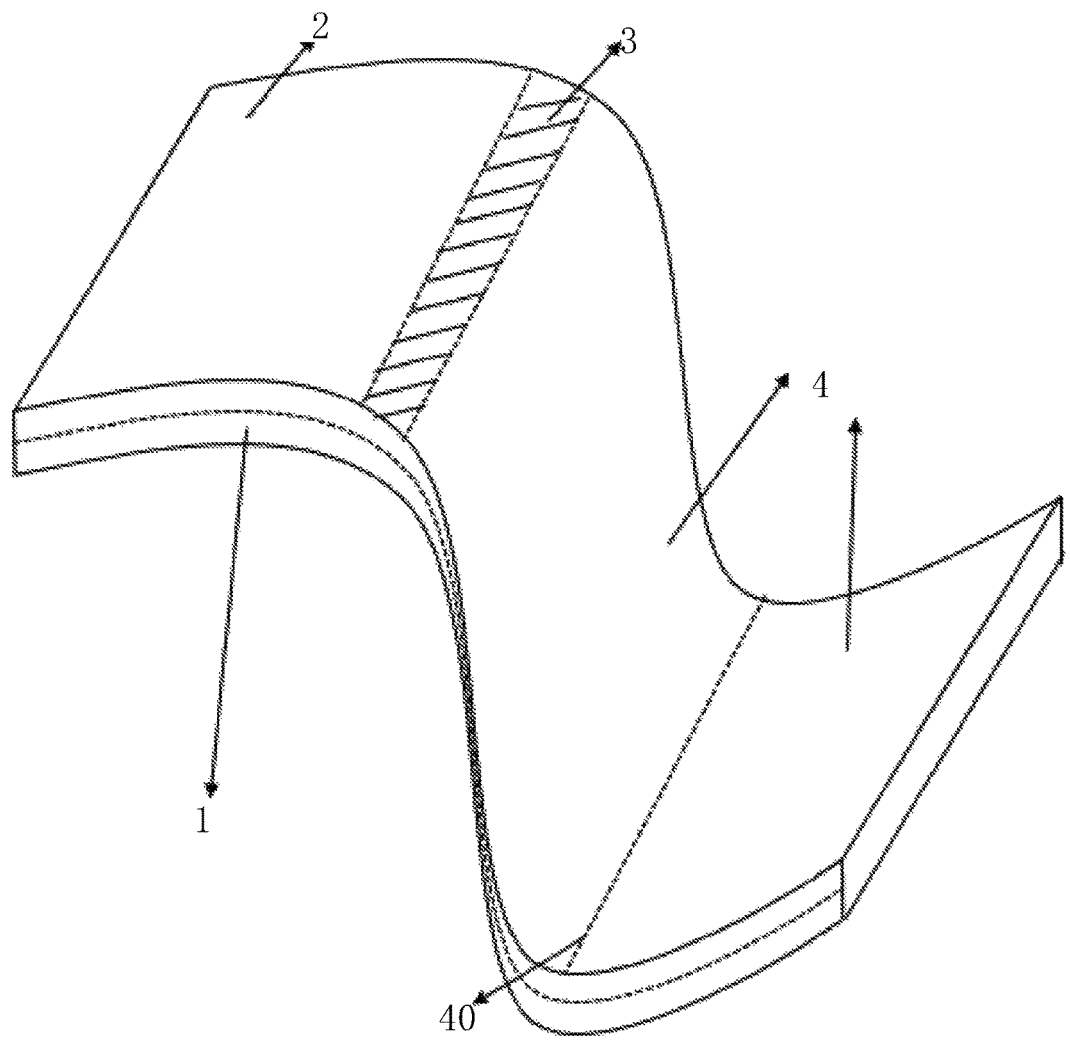
FIG. 1 is a schematic perspective view showing a flexible display screen structure according to the present invention in a curved condition.

As shown in FIG. 1, the first display zone 2 and the second display zone 4 are outwardly curved with a smaller radius of curvature by means of the outward curving zone 3 and the second display zone 4 is inwardly curved along the inward curving line 40 with a smaller radius of curvature. The first display zone 2 and the second display zone 4 are both operated for simultaneously curved surface displaying.

Figure 3:
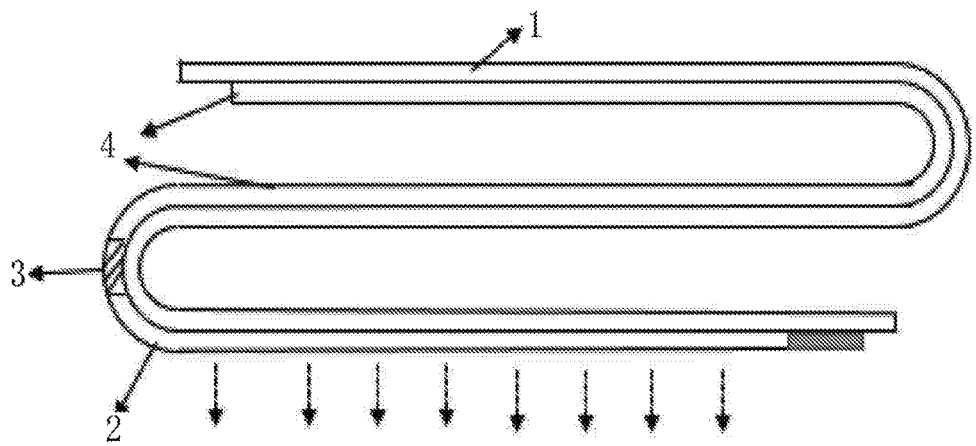
FIG. 3 is a schematic plan view illustrating the flexible display screen structure according to the present invention in a condition of being curved both inwardly and outwardly.

As shown in FIG. 3, the first display zone 2 and the second display zone 4 are outwardly curved with a larger radius of curvature by means of the outward curving zone 3 and the second display zone 4 is inwardly curved along the inward curving line 40 with a larger radius of curvature. Under this condition, the first display zone 2 is operated for displaying, while the second display zone 4 is in a non-displaying mode, such as standby or shutting down.

Figure 4:
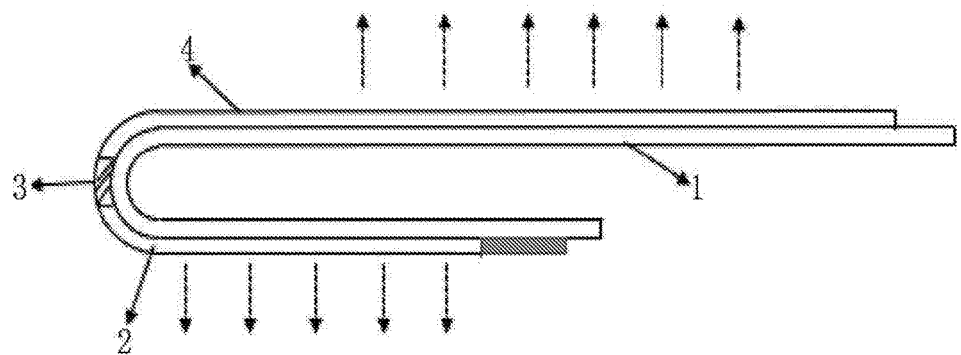
FIG. 4 is a schematic plan view illustrating the flexible display screen structure according to the present invention in a condition of being curved only outwardly.

As shown in FIG. 4, the first display zone 2 and the second display zone 4 are only outwardly curved with a relatively large radius of curvature by means of the outward curving zone 3. Under this condition, the first display zone 2 and the second display zone 4 are operated for flat surface displaying, providing an effect similar to dual side displaying.

Due to the arrangement that the first display zone 2, the outward curving zone 3, and the second display zone 4 commonly possess and share the same flexible substrate 1, and the first display zone 2 and the second display zone 4 are provided therein with commonly arranged array pixel circuits, while the outward curving zone 3 is only provided therein with a metallic connection line 31 for connection between the array pixel circuit of the first display zone 2 and the array pixel circuit of the second display zone 4 and a flexible organic layer covering the metallic connection lines 31 so as to reduce metal wires or lines arranged in the outward curving zone 3 and add a flexible organic layer in the outward curving zone 3, the first display zone 2 and the second display zone 4 may achieve outward curving through the outward curving zone 3 and poor displaying of the entire display resulting from cracking and peeling of a metal layer during outward curving of the flexible display screen can be reduced, thereby reducing the extent of damage of the flexible display screen during outward curving, improving reliability of outward curving, and effectively enhancing yield of the flexible display screen.

Figure 6:
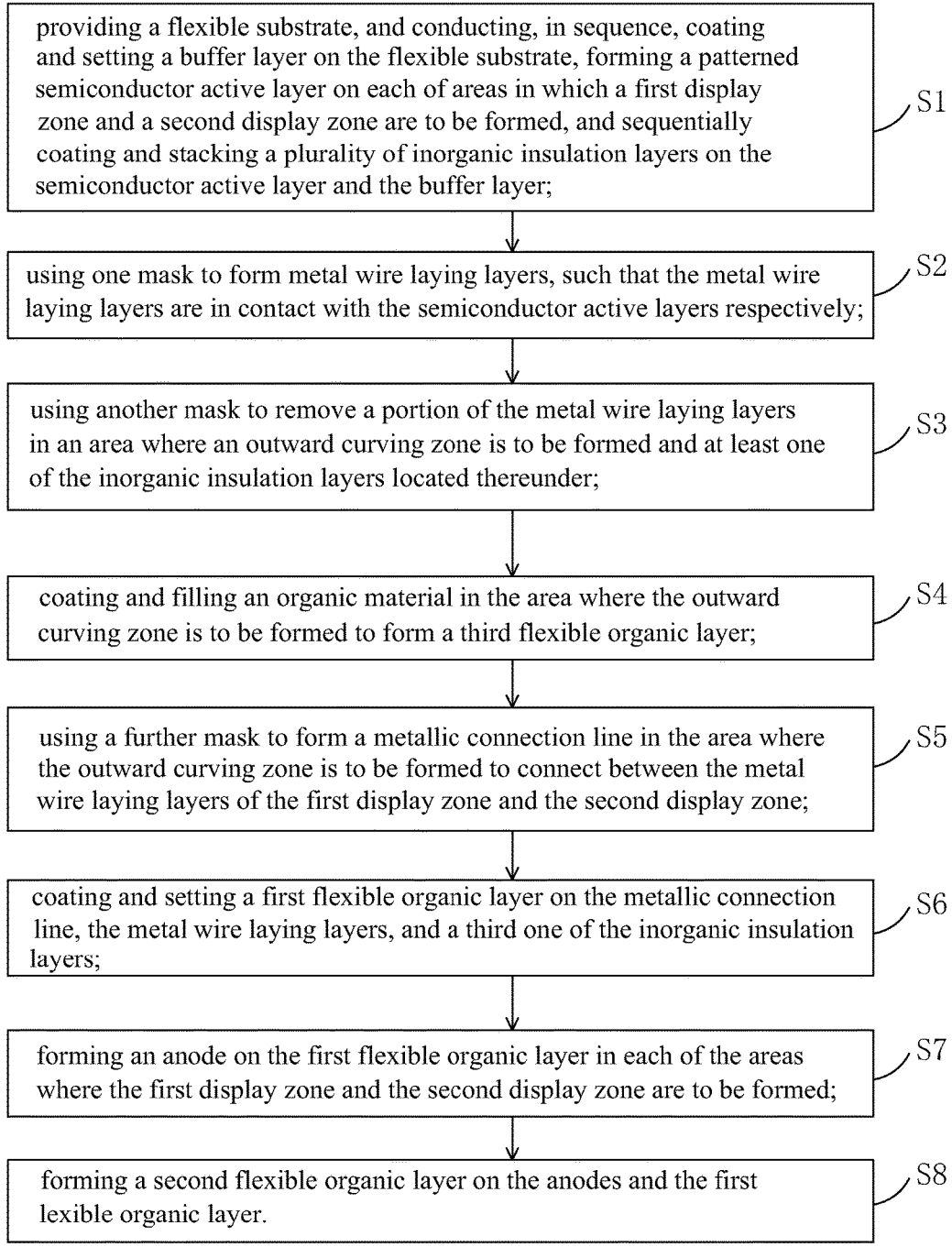
FIG. 6 is a flow chart illustrating a manufacturing method of a flexible display screen structure according to the present invention.
Figure 7:
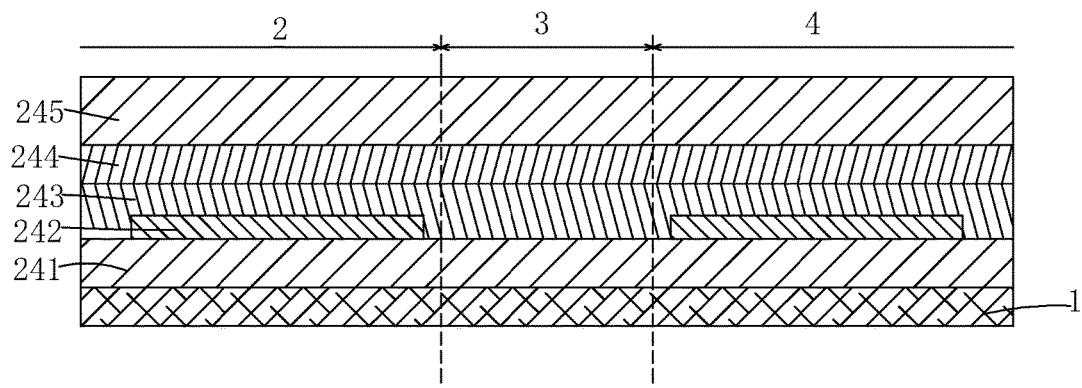
FIG. 7 is a schematic view illustrating Step S1 of the manufacturing method of the flexible display screen structure according to the present invention.

Referring to FIG. 6, in combination with FIGS. 1-5, the present invention also provides a manufacturing method of a flexible display screen structure, which comprises the following steps:

Step S1: as shown in FIG. 7, providing a flexible substrate 1, and conducting, in sequence, coating and setting a buffer layer 241 on the flexible substrate 1, forming a patterned semiconductor active layer 242 on each of areas in which a first display zone 2 and a second display zone 4 are to be formed, and sequentially coating and stacking a first inorganic insulation layer 243, a second inorganic insulation layer 244, and a third inorganic insulation layer 245 on the semiconductor active layer 242 and the buffer layer 241.

Specifically, the flexible substrate 1 is formed of a material comprising PI; the semiconductor active layer 242 is preferably formed of a material comprising LTPS; each of the buffer layer 241, the first inorganic insulation layer 243, the second inorganic insulation layer 244, and the third inorganic insulation layer 245 is preferably formed of a material comprising SiNx, SiOx, or a combination thereof.

Figure 8:
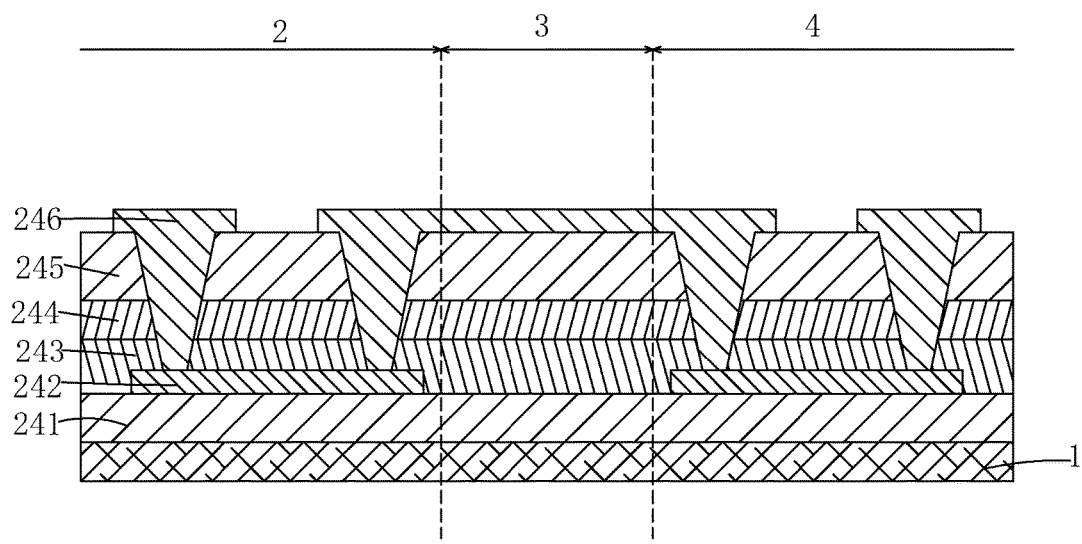
FIG. 8 is a schematic view illustrating Step S2 of the manufacturing method of the flexible display screen structure according to the present invention.

Step S2: as shown in FIG. 8, using one mask to form metal wire laying layers 246, such that the metal wire laying layers 246 are in contact with the semiconductor active layers 242 respectively.

The metal wire laying layers 246 comprise a densely distributed arrangement, which generally comprises scan lines, data lines, and various electrodes of thin-film transistors.

Figure 9:
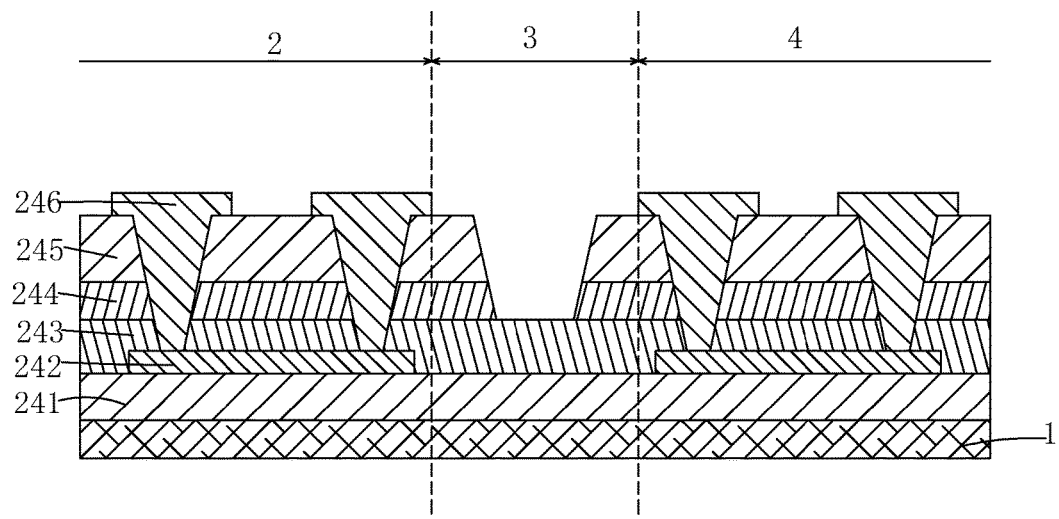
FIG. 9 is a schematic view illustrating Step S3 of the manufacturing method of the flexible display screen structure according to the present invention.

Step S3: as shown in FIG. 9, using another mask to remove a portion of the metal wire laying layers 246 in an area where an outward curving zone 3 is to be formed and at least one of the inorganic insulation layers located thereunder.

Step S3 is performed such that etching is conducted at most to the buffer layer 241, and options may be made according to the capability of manufacturing. FIG. 9 illustrates the second inorganic insulation layer 244 and the third inorganic insulation layer 245 have been etched off, while the first inorganic insulation layer 243 located on the buffer layer 241 is preserved.

Figure 10:
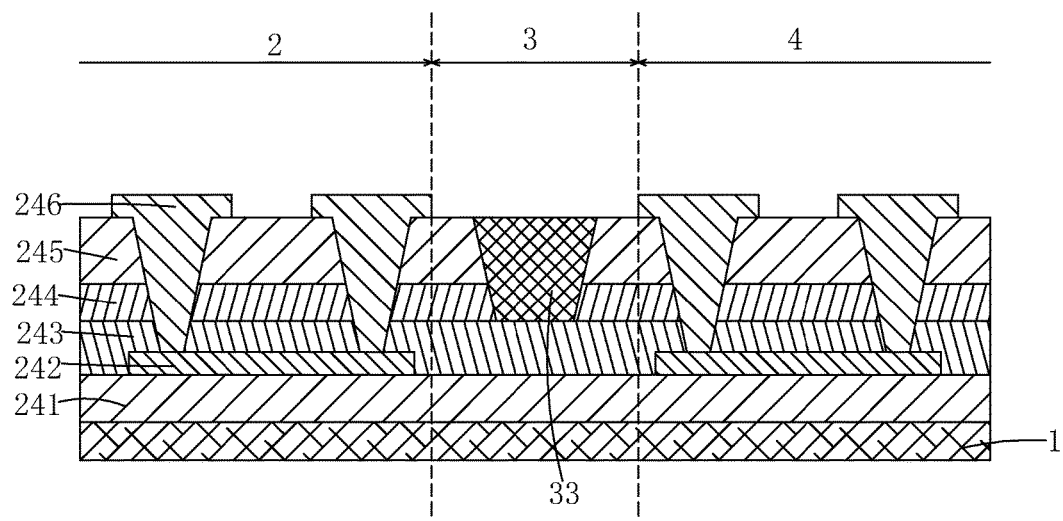
FIG. 10 is a schematic view illustrating Step S4 of the manufacturing method of the flexible display screen structure according to the present invention.

Step S4: as shown in FIG. 10, coating and filling an organic material in the area where the outward curving zone 3 is to be formed to form a third flexible organic layer 33.

Specifically, the organic material is preferably organic photoresist.

Figure 11:
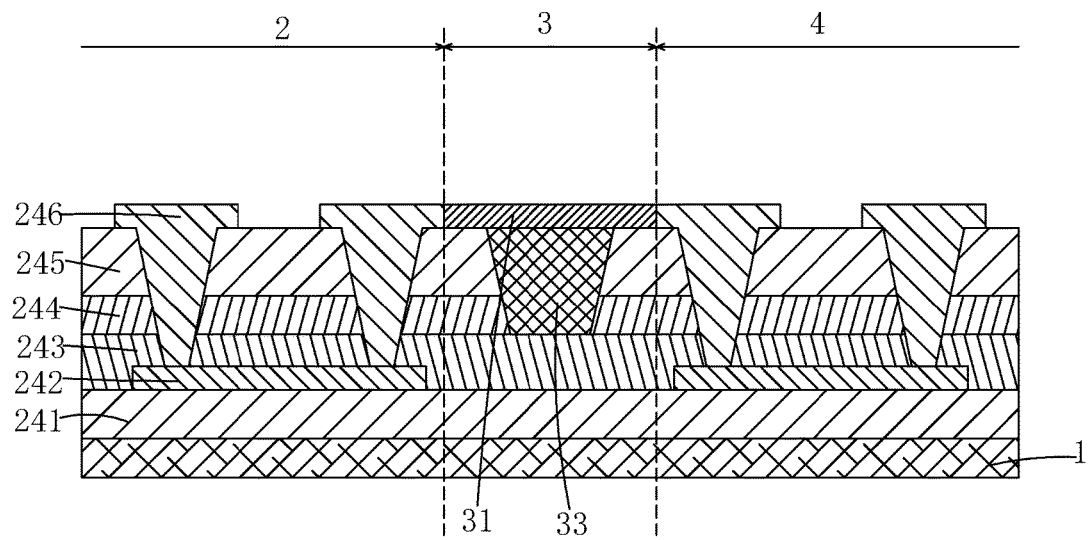
FIG. 11 is a schematic view illustrating Step S5 of the manufacturing method of the flexible display screen structure according to the present invention.

Step S5: as shown in FIG. 11, using a further mask to form a metallic connection line 31 in the area where the outward curving zone 3 is to be formed to connect between the metal wire laying layers 246 of the first display zone 2 and the second display zone 4.

Figure 12:
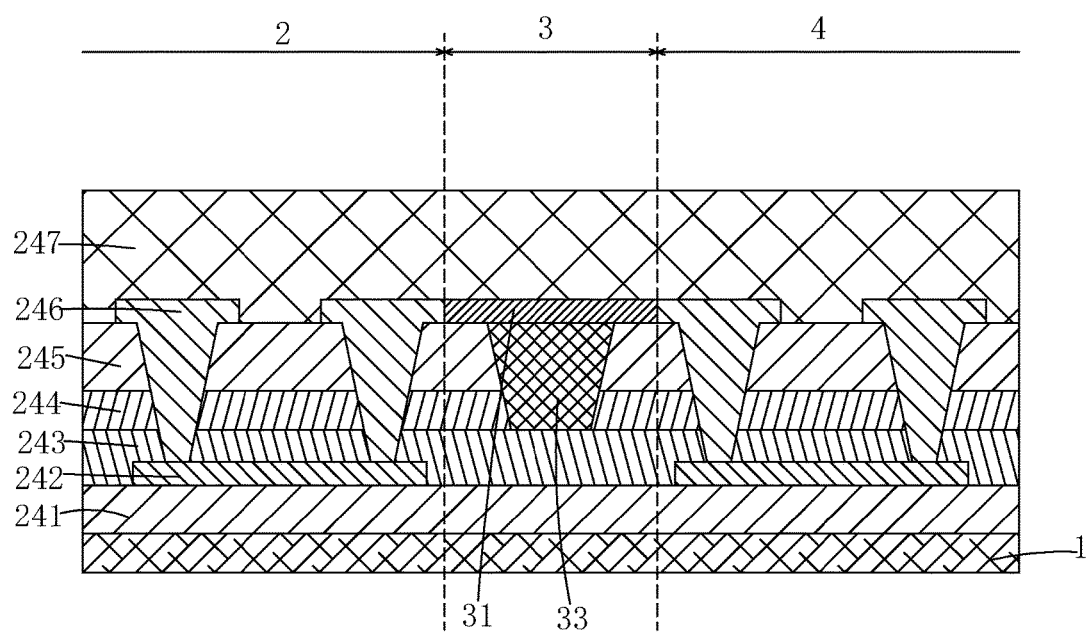
FIG. 12 is a schematic view illustrating Step S6 of the manufacturing method of the flexible display screen structure according to the present invention.

Step S6: as shown in FIG. 12, coating and setting a first flexible organic layer 247 on the metallic connection line 31, the metal wire laying layers 246, and the third inorganic insulation layer 245.

Specifically, the first flexible organic layer 247 is preferably formed of a material comprising organic photoresist.

Figure 13:
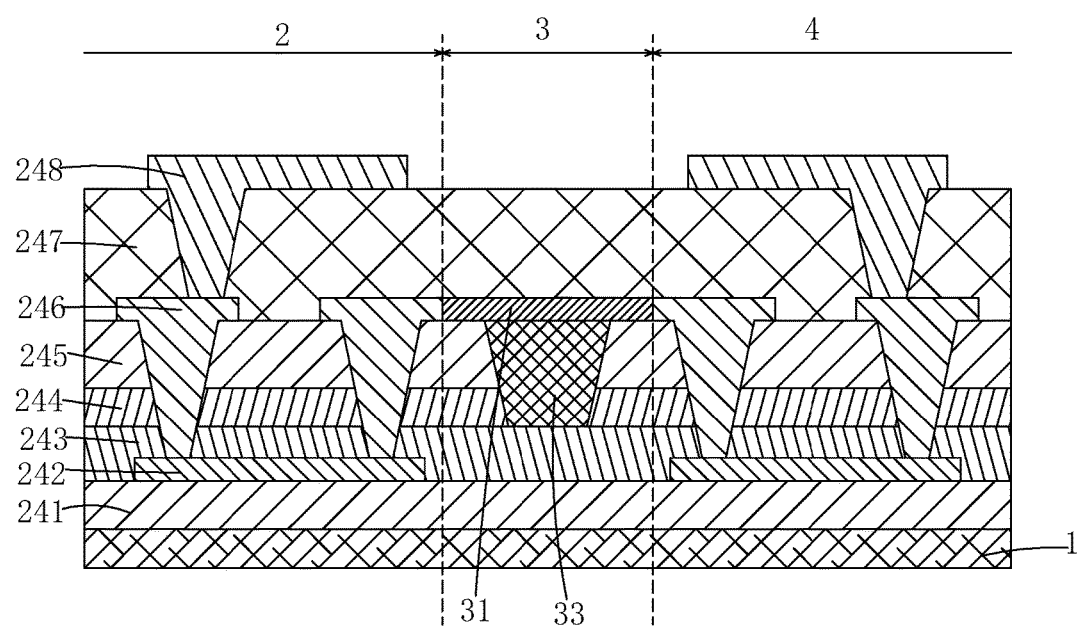
FIG. 13 is a schematic view illustrating Step S7 of the manufacturing method of the flexible display screen structure according to the present invention.

Step S7: as shown in FIG. 13, forming an anode 248 on the first flexible organic layer 247 in each of the areas where the first display zone 2 and the second display zone 4 are to be formed.

The anodes 248 are in contact with the metal wire laying layers 246 and the semiconductor active layers 242, the metal wire laying layers 246, and the anodes 248 constitute array pixel circuits respectively.

Specifically, the anode 248 is preferably formed of a material comprising ITO.

Step S8: referring to FIG. 5, forming a second flexible organic layer 249 on the anodes 248 and the first flexible organic layer 247.

The second flexible organic layer 249 is arranged to expose portions of the anodes 248.

Specifically, the second flexible organic layer 249 is preferably formed of a material comprising organic photoresist.

The above-described method allows a portion of the metal wire laying layer 246 in the area where the outward curving zone 3 is to be formed and at least one inorganic insulation located thereunder to be removed and then fills an organic material therein to form the third flexible organic layer 33, followed by formation of the metallic connection line 31 to connect the metal wire laying layers 246 of the first display zone 2 and the second display zone 4 to each other, thereby reducing metal wiring inside the outward curving zone 3, while adding a flexible organic layer in the outward curving zone 3 to allow the first display zone 2 and the second display zone 4 to outwardly curve through the outward curving zone 3 in a manner of reducing poor displaying of the entire display resulting from cracking and peeling of a metal layer during outward curving of the flexible display screen so as to reduce the extent of damage of the flexible display screen during outward curving, improve reliability of outward curving, and effectively enhance yield of the flexible display screen.

In summary, the present invention provides a flexible display screen structure, which comprises an outward curving zone arranged between a first display zone and a second display zone, such that these three ones commonly possess and share the same flexible substrate, and the first display zone and the second display zone are provided therein with commonly arranged array pixel circuits, while the outward curving zone is only provided therein with a metallic connection line for connection between the array pixel circuit of the first display zone and the array pixel circuit of the second display zone and a flexible organic layer covering the metallic connection lines so as to reduce metal wires or lines arranged in the outward curving zone and add a flexible organic layer in the outward curving zone, whereby the first display zone and the second display zone may achieve outward curving through the outward curving zone and poor displaying of the entire display resulting from cracking and peeling of a metal layer during outward curving of the flexible display screen can be reduced, and thus reducing the extent of damage of the flexible display screen during outward curving, improving reliability of outward curving, and effectively enhancing yield of the flexible display screen. The present invention provides a manufacturing method of a flexible display screen structure, which allows a portion of a metal wire laying layer in an area where an outward curving zone is to be formed and at least one inorganic insulation located thereunder to be removed and then fills an organic material therein to form a third flexible organic layer, followed by formation of a metallic connection line to connect metal wire laying layers of the first display zone and the second display zone to each other, thereby reducing metal wiring inside the outward curving zone, while adding a flexible organic layer in the outward curving zone to allow the first display zone and the second display zone to outwardly curve through the outward curving zone in a manner of reducing poor displaying of the entire display resulting from cracking and peeling of a metal layer during outward curving of the flexible display screen so as to reduce the extent of damage of the flexible display screen during outward curving, improve reliability of outward curving, and effectively enhance yield of the flexible display screen.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A flexible display screen structure, comprising a flexible substrate, a first display zone arranged on the flexible substrate, a second display zone arranged on the flexible substrate, and an outward curving zone arranged on the flexible substrate and connected with the first display zone and the second display zone;

wherein each of the first display zone and the second display zone is provided therein with an array pixel circuit and the outward curving zone comprises a metallic connection line for connection between the array pixel circuit of the first display zone and the array pixel circuit of the second display zone and a flexible organic layer covering the metallic connection line; and the first display zone and the second display zone are outwardly curvable through the outward curving zone;

wherein a buffer layer is arranged on the flexible substrate and covers the first display zone, the outward curving zone, and the second display zone, and a plurality of inorganic insulation layers arranged on the buffer layer to form a stack of inorganic insulation layers, the stack being arranged to extend across and covers the first display zone, the outward curving zone, and the second display zone, wherein a recess is formed in the stack of inorganic insulation layer in the outward curving zone; and wherein the flexible organic layer of the outward curving zone comprises multiple layers respectively covering upper and lower sides of the metallic connection line, wherein at least one of the multiple layers of the flexible organic layer is arranged at the lower side of the metallic connection line, such that the at least one of the multiple layers of the flexible organic layer is disposed in the recess that is formed in the stack of inorganic insulation layer in the outward curving zone.

2. The flexible display screen structure as claimed in claim 1, wherein the first display zone, the second display zone, and the outward curving zone are arranged on the same side of the flexible substrate.

3. The flexible display screen structure as claimed in claim 1, wherein each of the first display zone and the second display zone comprises: the buffer layer arranged on the flexible substrate, a patterned semiconductor active layer arranged on the buffer layer, the plurality of inorganic insulation layers sequentially stacked on the semiconductor active layer and the buffer layer, a metal wire laying layer arranged on a topmost one of the inorganic insulation layers and in contact with the semiconductor active layer, a first flexible organic layer covering the metal wire laying layer, an anode arranged on the first flexible organic layer and in contact with the metal wire laying layer, and a second flexible organic layer arranged on the anode and the first flexible organic layer, wherein the second flexible organic layer is structured to expose a portion of the anode and the semiconductor active layer, the metal wire laying layer, and the anode collectively constitute the array pixel circuit;

wherein the outward curving zone comprises the buffer layer arranged on the flexible substrate, the plurality of inorganic insulation layers sequentially stacked on the buffer layer, a third flexible organic layer arranged on the buffer layer and covering an undersurface of the metallic connection line, a first flexible organic layer and a second flexible organic layer stacked on and covering a top surface of the metallic connection line, the metallic connection line being connected with the metal wire laying layers of the first display zone and the second display zone.

4. The flexible display screen structure as claimed in claim 3, wherein the flexible substrate is formed of a material comprising polyimide.

5. The flexible display screen structure as claimed in claim 3, wherein each of the flexible organic layers is formed of a material comprising organic photoresist.

6. A manufacturing method of a flexible display screen structure, comprising the following steps:

Step S1: providing a flexible substrate, and conducting, in sequence, coating and setting a buffer layer on the flexible substrate, forming a patterned semiconductor active layer on each of areas in which a first display zone and a second display zone are to be formed, and sequentially coating and stacking a plurality of inorganic insulation layers on the semiconductor active layer and the buffer layer to form a stack of inorganic insulation layers;

Step S2: using one mask to form metal wire laying layers, such that the metal wire laying layers are in contact with the semiconductor active layers respectively;

Step S3: using another mask to remove a portion of the metal wire laying layers in an area where an outward curving zone is to be formed and at least one of the inorganic insulation layers located thereunder to form a recess in the stack of inorganic insulation layers in the area where an outward curving zone is to be formed;

Step S4: coating and filling an organic material in the recess that is formed in the stack of inorganic insulation layers in the area where the outward curving zone is to be formed to form a third flexible organic layer;

Step S5: using a further mask to form a metallic connection line in the area where the outward curving zone is to be formed to connect between the metal wire laying layers of the first display zone and the second display zone, wherein an undersurface of the metallic connection line is covered by the third flexible organic layer;

Step S6: coating and setting a first flexible organic layer on the metallic connection line, the metal wire laying layers, and a third one of the inorganic insulation layers, wherein the first flexible organic layer covers a top surface of the metallic connection line;

Step S7: forming an anode on the first flexible organic layer in each of the areas where the first display zone and the second display zone are to be formed;

wherein the anodes are respectively in contact with the metal wire laying layers and the semiconductor active layers, the metal wire laying layers, and the anodes constitute array pixel circuits respectively; and Step S8: forming a second flexible organic layer on the anodes and the first flexible organic layer;

wherein the second flexible organic layer is arranged to expose portions of the anodes.

7. The manufacturing method of the flexible display screen structure as claimed in claim 6, wherein the flexible substrate is formed of a material comprising polyimide.

8. The manufacturing method of the flexible display screen structure as claimed in claim 6, wherein each of the first flexible organic layer, the second flexible organic layer and the third flexible organic layer is formed of a material comprising organic photoresist.

9. A manufacturing method of a flexible display screen structure, comprising the following steps:

Step S1: providing a flexible substrate, and conducting, in sequence, coating and setting a buffer layer on the flexible substrate, forming a patterned semiconductor active layer on each of areas in which a first display zone and a second display zone are to be formed, and sequentially coating and stacking a plurality of inorganic insulation layers on the semiconductor active layer and the buffer layer to form a stack of inorganic insulation layers;

Step S2: using one mask to form metal wire laying layers, such that the metal wire laying layers are in contact with the semiconductor active layers respectively;

Step S3: using another mask to remove a portion of the metal wire laying layers in an area where an outward curving zone is to be formed and at least one of the inorganic insulation layers located thereunder to form a recess in the stack of inorganic insulation layers in the area where an outward curving zone is to be formed;

Step S4: coating and filling an organic material in the recess that is formed in the stack of inorganic insulation layers in the area where the outward curving zone is to be formed to form a third flexible organic layer;

Step S5: using a further mask to form a metallic connection line in the area where the outward curving zone is to be formed to connect between the metal wire laying layers of the first display zone and the second display zone, wherein an undersurface of the metallic connection line is covered by the third flexible organic layer;

Step S6: coating and setting a first flexible organic layer on the metallic connection line, the metal wire laying layers, and a third one of the inorganic insulation layers, wherein the first flexible organic layer covers a top surface of the metallic connection line;

Step S7: forming an anode on the first flexible organic layer in each of the areas where the first display zone and the second display zone are to be formed;

wherein the anodes are respectively in contact with the metal wire laying layers and the semiconductor active layers, the metal wire laying layers, and the anodes constitute array pixel circuits respectively; and Step S8: forming a second flexible organic layer on the anodes and the first flexible organic layer;

wherein the second flexible organic layer is arranged to expose portions of the anodes;

wherein the flexible substrate is formed of a material comprising polyimide; and wherein each of the first flexible organic layer, the second flexible organic layer and the third flexible organic layer is formed of a material comprising organic photoresist.

* * * * *